United States Patent

Yoshikawa et al.

[11] Patent Number: 5,852,445
[45] Date of Patent: Dec. 22, 1998

[54] METHOD OF VERIFYING INTEGRATED CIRCUIT OPERATION BY COMPARING STORED DATA STRUCTURES CORRESPONDING TO INTEGRATED CIRCUIT LOGIC CELLS

[75] Inventors: Satoru Yoshikawa; Tetsu Tanizawa, both of Kawasaki, Japan

[73] Assignee: Fujitsu Limited, Kawasaki, Japan

[21] Appl. No.: 552,150

[22] Filed: Nov. 2, 1995

Related U.S. Application Data

[63] Continuation of Ser. No. 204,503, Mar. 2, 1994, abandoned.

[30] Foreign Application Priority Data

Mar. 18, 1993 [JP] Japan ........................................ 5-59069

[51] Int. Cl.$^6$ ........................................................ G06T 11/00
[52] U.S. Cl. ................................................................ 345/440
[58] Field of Search ................................... 395/140–143, 395/908, 916, 919–921; 364/480–491; 345/440

[56] References Cited

U.S. PATENT DOCUMENTS 5,274,568 12/1993 Blinne et al. ............................ 364/489

*Primary Examiner*—Almis R. Jankus
*Attorney, Agent, or Firm*—Staas & Halsey

[57] ABSTRACT

A method of verifying integrated circuit operation compares stored data structures which correspond to integrated circuit logic cells. Simulated graph data for a plurality of different types of logic cells are first determined by varying a plurality of factors including: the delay time of a logic cell after a signal is inputted until a signal is outputted, load capacity, and transient time of the inputted signal. The acquired graph data for each of the logic cells is then processed into data having a common origin at a common value and stored into a cell library. The processed graph data is then extracted as general-use graph data by comparing the acquired graph data with one another. A selector selects graph data which corresponds to an object of calculation from the library and an arithmetic logic unit calculates delay time of an actual logic cell based upon the selected graph data.

13 Claims, 13 Drawing Sheets

```
              DLS1
                (
GRAPH 101 : SLEW1 : (CL11,Tgate11), (CL12,Tgate12), (CL13,Tgate13)----
            SLEW2 : (CL21,Tgate21), (CL22,Tgate22), (CL23,Tgate23)---
            SLEW3 : (CL31,Tgate31), (CL32,Tgate32), (CL33,Tgate33)---

GRAPH101                : PROPER NAME
SLEW1, SLEW2, SLEW3--- : SLEW RATE
CL                      : LOAD CAPACITY
Tgate                   : DELAY TIME
```

*FIG. 17C*

DSL22

┌─────────────────────────────────┐
│ PIECE-WISE GRAPH PART (COMMON) │
└─────────────────────────────────┘

GRAPH101: SLEW1: (CL11,0), (CL12,Tout11), (CL13,Tout12) ----
          SLEW2: (CL21,0), (CL22,Tout21), (CL23,Tout22) ----
          SLEW3: (CL31,0), (CL32,Tout31), (CL33,Tout32) ----

GRAPH102  SLEW1:
          SLEW2:
          SLEW3:

┌──────────┐
│ EXAMPLE  │
└──────────┘

NAME: CELL

T01 = 0000
  T02 = 1111
  T03 = 3333

SLG (SeLect Graph) = GRAPH 101 ⇐

NAME: CELL

T01 = 4444
  T02 = 5555
  T03 = 6666

SLG (SeLect Graph) = GRAPH 102 ⇐

```
        DSL23
        (
   SLEW1  : (CL11,0),(CL12,Tout11),(CL13,Tout12) ----
   SLEW2  : (CL21,0),(CL22,Tout21),(CL23,Tout22) ----
   SLEW3  : (CL31,0),(CL32,Tout31),(CL33,Tout32) ----

SLEW1, SLEW2, SLEW3 ---
   CL
   Tout                    : INCREMENT OF OUTPUT
                             SLEW RATE BY LOAD
```

METHOD OF VERIFYING INTEGRATED CIRCUIT OPERATION BY COMPARING STORED DATA STRUCTURES CORRESPONDING TO INTEGRATED CIRCUIT LOGIC CELLS

This application is a continuation of application Ser. No. 08/204,503 filed Mar. 2, 1994, now abandoned.

BACKGROUND OF THE INVENTION

1. Field of the Invention

The present invention relates to a method of generating data for logic calculation, a method of logic calculation and a logic calculator, and more particularly to a structure of data to be stored in a cell library and improvement of a method and an apparatus for verifying operation of a semiconductor integrated circuit based on these data.

2. Description of the Related Art

The semiconductor integrated circuit (hereinafter referred to as an LSI) has achieved a higher speed and a larger scale of integration in recent years by the development of refinement techniques of the LSI device. When a high speed operation of an LSI device is demanded as described above, a very strict status is presented also for the timing among LSI chips which are components of the device. Thus, verification of the operation by a logic calculator of high precision becomes necessary before a mask process for an individual LSI chip is designed.

In particular, propagation delay time (hereinafter referred to simply as delay time) of a logic cell is affected by differences in delay due to an input slew rate, wiring resistance transistor path, environment (temperature, power source voltage and process) and so on. Therefore, in order to perform highly precise logic calculation, it becomes necessary to generate a cell library that is able to express the calculation sufficiently.

Here, the related art of the present invention will be described. For example, when data for a logic calculation for verifying the operation of a new LSI device and the delay time Tgate of a logic cell 1 of a circuit calculation model such as shown in FIG. 1 is expressed, a method of simulating the delay time with one line of a polygonal line graph as shown in FIG. 2 is the generality.

As a circuit calculation model, a logic cell 1 is connected in series with a logic cell 2 and a load capacity CL is connected to an output portion of the logic cell 1, as shown in FIG. 1 for instance. Besides, the load capacity CL of the logic cell 1 is made variable, thereby to generating data for logic calculation on the circuit calculation.

The polygonal line graph in FIG. 2 shows delay time versus load capacity characteristics. The ordinate axis represents the delay time Tgate of the logic cell and the abscissa axis represents the load capacity CL. Further, the delay time Tgate of the logic cell 1 is expressed by a time equation (1), that is:

$$Tgate = T0 + K \times CL \quad (1)$$

Where, T0 represents the delay time of the logic cell 1 at time of no load, which becomes a first parameter. K represents a load dependent factor of the delay time, which becomes a second parameter. The factor K is expressed by an expression (2), that is:

$$K = \Delta Tgate / \Delta CL \quad (2)$$

$\Delta$Tgate represents a delay time variation portion of the logic cell 1, and $\Delta$CL represents the variation portion of the load capacity. $\Delta$Tgate and $\Delta$CL differ depending on circuit calculation conditions such as differences in delay due to an input slew rate, wiring resistance and transistor path, ambient environment (temperature, power source voltage and process) and so on. Further, the load capacity CL becomes a third parameter. $C_{D\_R1}$ and $C_{D\_R2}$ represent capacity values at bent back points, which become a fourth parameter.

Besides, the reason in which the delay time versus load capacity characteristics show a polygonal line graph is that a gradient is provided in the factors K1, K2, K3 . . . as shown in FIG. 2. When a large load capacity CL is connected to the output of the logic cell 1, the waveform becomes dull at the output of the logic cell 1, and the slew rate of the output waveform is increased as compared with the input waveform. Therefore, it is possible to correct the delay time of the logic cell 1 by including the increment of the delay time by the slew rate of the logic cell 2 in the delay time of the logic cell 1.

To be concrete, the correction is made by varying the gradient with respect to the load capacity CL to the factors K1, K2, K3 and so on. Here, the slew rate means the waveform rise time. For example, the slew rate is defined by the period of time from the rise starting time of an "L" (low) level of a signal to the time of crossing a threshold level of the circuit concerned or the period of time from the rise starting time of an "L" level of the signal to the time of reaching an "H" (high) level of the signal in a transition state from an "L" level to an "H" level of the signal waveform.

As described above, when the delay time Tgate of the logic cell 1 of a circuit calculation model as shown in FIG. 1 is expressed, the delay time Tgate of an LSI device is computed from an approximate expression such as shown in the time equation (1) and a polygonal line graph using four parameters included in respective logic cells 1 and 2.

SUMMARY OF THE INVENTION

It is an object of the present invention to perform highly precise logic calculations by generating data for the logic calculations, without expressing relational characteristics of delay time versus load capacity with one line of a polygonal line graph, and by forming these characteristics into a plurality of characteristic graphs, from those characteristic graphs.

It is another object of the present invention to process data for logic calculation to be stored in a cell library, thereby to aim at reduction of the memory capacity.

It is still another object of the present invention to verify the operation of a semiconductor integrated circuit by using data for logic calculation obtained by circuit calculation directly.

Namely, a preferred embodiment of a method of generating data according to the present invention is shown in FIG. 5. First, according to a method of generating data, the steps include executing simulation for acquiring graph data consisting of plurality of points with respect to a plural types of logic cells, having different structures of inner circuits, by changing a delay time after a signal is inputted until it is outputted, acquiring load capacity and/or transient time of the inputted signal; processing the acquired graph data for each logic cell into data having an origin at a common value; and extracting approximate data as general-use graph data by comparing the processed plurality with one another.

Simulation for acquiring graph data is executed based on information of an active element and/or a passive element which composes the logic cells. Graph data acquired from the simulation shows the relationship of the operating time of the logic cell with the passive element. Further, graph data acquired from the simulation shows the relationship of the operating time of the active element with the passive element. Furthermore, graph data acquired from the simulation shows the relationship of the operating time of the logic cell with the active element.

Next, a preferred embodiment of a method of logic calculation according to the present invention is shown in FIG. 8. A method of logic calculation includes the steps: of acquiring graph data of a logic cell, which is an object of calculation, from a library possessing graph data of standard delay time having an origin in common with respect to each of a plurality of logic cells; setting an inherent condition of the logic cell which is an object of calculation; and calculating the delay time of an actual logic cell which is an object calculation by adding the inherent condition set the acquired graph data.

A logic cell which is an object calculation composes a generic-circuit being connected to another logic cell; the delay time required to operate the generic-circuit is calculated by using output information of each logic cell as the inherent condition for the logic cell at a next stage. The inherent condition is information of the transient time of the signal inputted from a front stage of the logic cell, which is an object of calculation. Information outputted from a generic-circuit is calculated by referring to the calculated delay time required to operate the generic-circuit when predetermined input information is inputted to the generic-circuit.

Further, a library for graph data of the standard delay time is generated while including the steps of: executing simulation for acquiring graph data consisting of a plurality of points with respect to plural types of logic cells having different structures of inner circuits by changing a delay time after a signal is inputted until it is outputted, acquiring load capacity and/or transient time of the inputted signal; processing the acquired graph data for each logic cell into data having an origin at a common value; and extracting approximate data as general-use graph data by comparing the processed plurality of with another.

A preferred embodiment of a logic calculator according to the present invention is shown in FIG. 9. A logic calculator includes a library for possessing graph data of a standard delay time having an origin in common with respect to each of a plurality logic cells selected for acquiring graph data of a logic cell which is an object of calculation from the library; memory for setting an inherent condition of the logic cell which is an object of calculation; and an arithmetic and logical unit for calculating the delay time of an actual logic cell which is an object of calculation by adding the set inherent condition to the acquired graph data.

By adopting such method and structure, it becomes possible to perform highly precise logic calculation of a diversified semiconductor integrated circuit, while restraining an increase of the acquired memory capacity, which greatly contributes to improvement of performance and reliability of the logic calculator concerned.

BRIEF DESCRIPTION OF THE DRAWINGS

FIG. 17C is a diagram for explaining a cell library structure in which the circuit calculation models shown in FIG. 16A to FIG. 16C are processed;

DESCRIPTION OF THE PREFERRED EMBODIMENTS

Now, according to the related art of the present invention, when data for logic calculation is generated, circuit calculation is made under typical conditions such as differences in delay due to an input slew rate Tsin, wiring resistance, transistor path, and environment (temperature, power source voltage and process, one line of a polygonal line graph is formed from the result of calculation with a delay time T0 of a cell at a time of no load, a load dependent factor K of the delay time, or the like as the parameters.

Further, when logic calculation of an LSI to be designed is made, the delay time Tgate of the LSI to be designed is computed using the data for a logic calculator obtained from the polygonal graph and the time equation (1), thereby approximating the logic calculation.

Figures 12A, 12B:
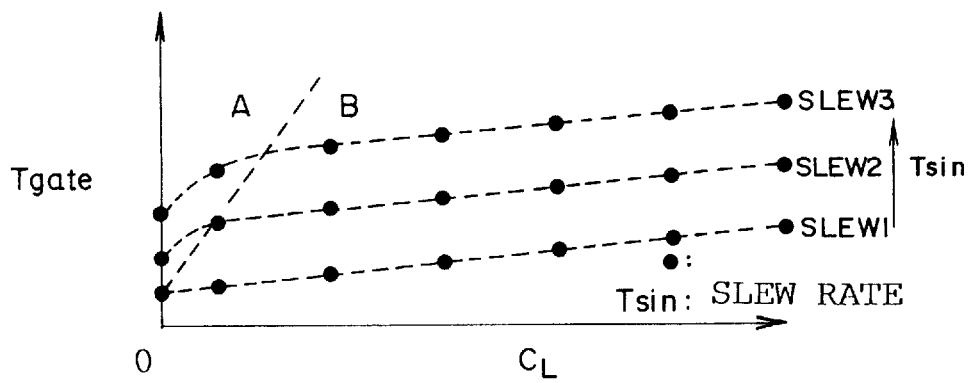
FIG. 12A is a characteristic diagram of Tgate versus CL of the circuit calculation model shown in FIG. 10.
FIG. 12B is a diagram for explaining a cell library structure of the circuit calculation model shown in FIG. 10.

As a result, when a new LSI is designed to achieve super high fineness and high density according to the requirements for achieving high integration and densification, the influence of the slew rate Tsin exerted on a logic cell 2 at the next stage by a load capacity CL, such as that shown in FIGS. 12A–12B, becomes inaccurate at approximate values of the delay time Tgate. This is because the information is obtained by using the data for the logic calculator obtained from one line of the polygonal line graph and the time equation (1), thus giving rise to a problem of preventing highly precise logic calculation.

Here, the influence by the input slew rate Tsin of the logic cell 2 will be explained. For example, when the input slew rate Tsin is increased due to an increase of the load capacity CL, the delay time is increased by such an effect as described hereunder. Besides, the delay time Tgate of a newly designed LSI differs depending on the type of the logic cell 2 at the next stage and the load capacity CL.

Figure 1:
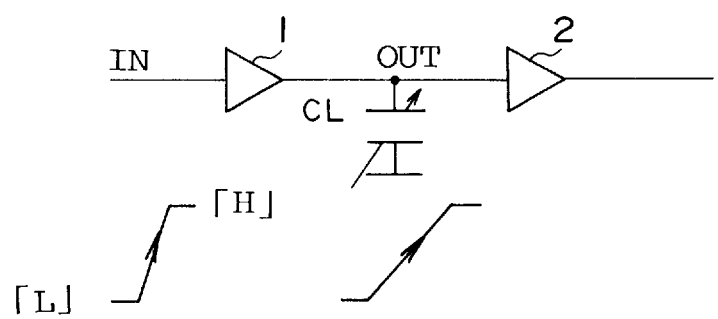
FIG. 1 is a block diagram of a circuit calculation model expressing delay time of a logic cell according to the related art of the present invention.
Figure 2:
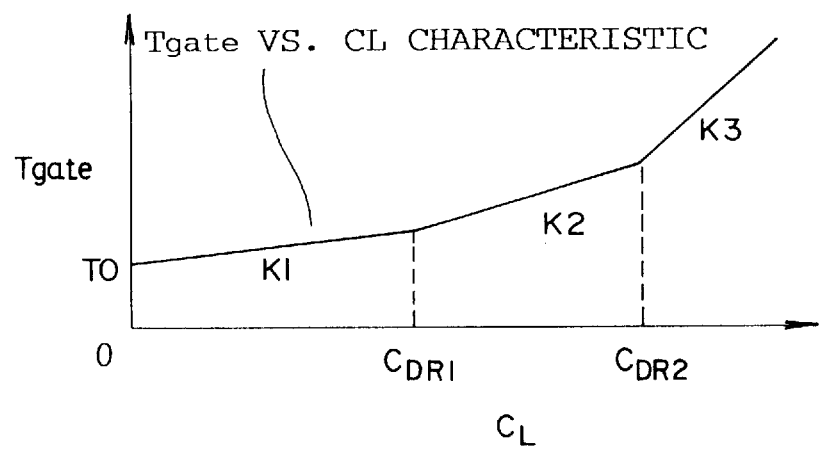
FIG. 2 is a characteristic diagram for explaining the relationship of delay time Tgate versus load capacity CL of the circuit calculation model shown in FIG. 1.
Figure 3:
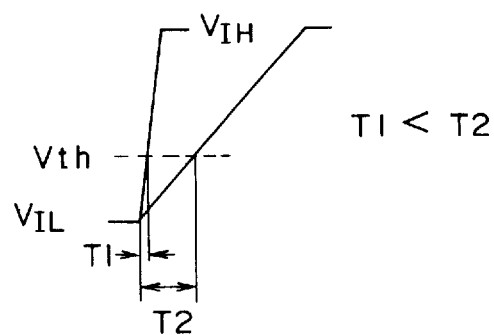
FIG. 3 is a signal waveform diagram for explaining problems of the circuit calculation model shown in FIG. 1.

① When an LSI is designed so as to achieve super fineness and densification, the time required for the input voltage to reach a circuit threshold value Vth of the logic cell 2 gets longer by the load capacity CL. Namely, when the input slew rate Tsin is changed due to the increase of the load capacity CL, an period of time required to reach the circuit threshold value Vth from the rise starting time of the signal "L" level gets longer from T1 to T2 (T1<T2), as shown in FIG. 3. Besides, the circuit threshold value Vth is different depending on the type of the logic cell 2 at the latter stage such as shown in FIG. 1.

② Further, when an LSI is designed so as to achieve super fineness and densification, the waveform rise time required to reach the input voltage "H" level=$V_{1H}$ from the input voltage "L" level $V_{1L}$ gets longer by the load capacity CL. Namely, when the load capacity CL of the logic cell 1 is small as shown in FIG. 1, the gate is inverted in a state that the logic cell 1 is not turned ON completely (in a state that a driving impedance is high). Hence, the delay time is increased.

Figure 4A:
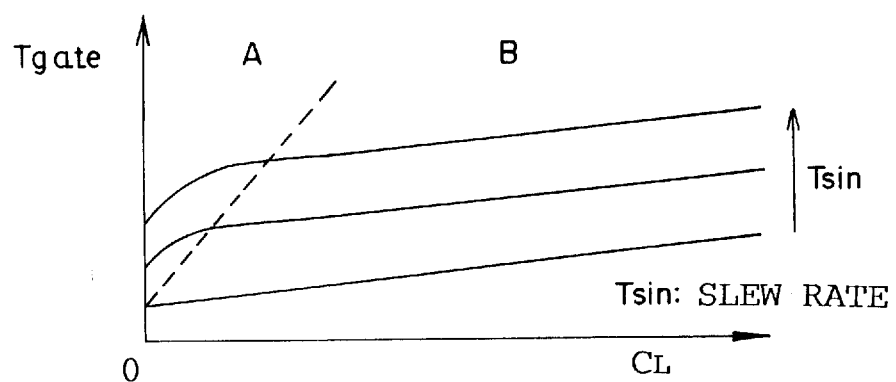
FIG. 4A is a characteristic diagram of Tgate versus CL for explaining problems of the circuit calculation model shown in FIG. 1.
Figure 4B:
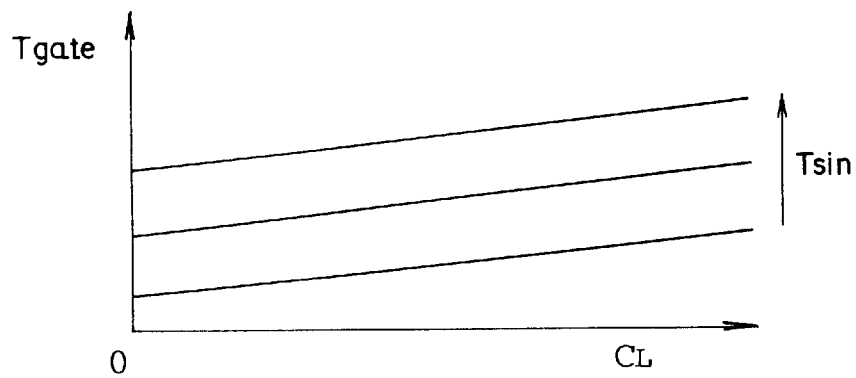
FIG. 4B is another characteristic diagram of Tgate versus CL for explaining problems of the circuit calculation model shown in FIG. 1.

With this, as shown in a relational characteristic diagram of the delay time Tgate versus the load capacity CL shown in FIG. 4A, there appears an area A where the input slew rate Tsin changes non-linearly and an area B where it changes linearly. The boundary between these areas A and B differs depending on the type of the logic cells 1 and 2 and the input slew rate Tsin. Characteristics having no distinction between the areas A and B are shown sometimes as shown in FIG. 4B depending on the logic cells 1 and 2.

From the foregoing, an extensive increase of parameters related to the load dependent factor K is compelled to express the relational characteristics of the delay time Tgate versus the load capacity CL (hereinafter also referred to as operating time versus passive element) with one line of a polygonal line graph.

Figure 5:
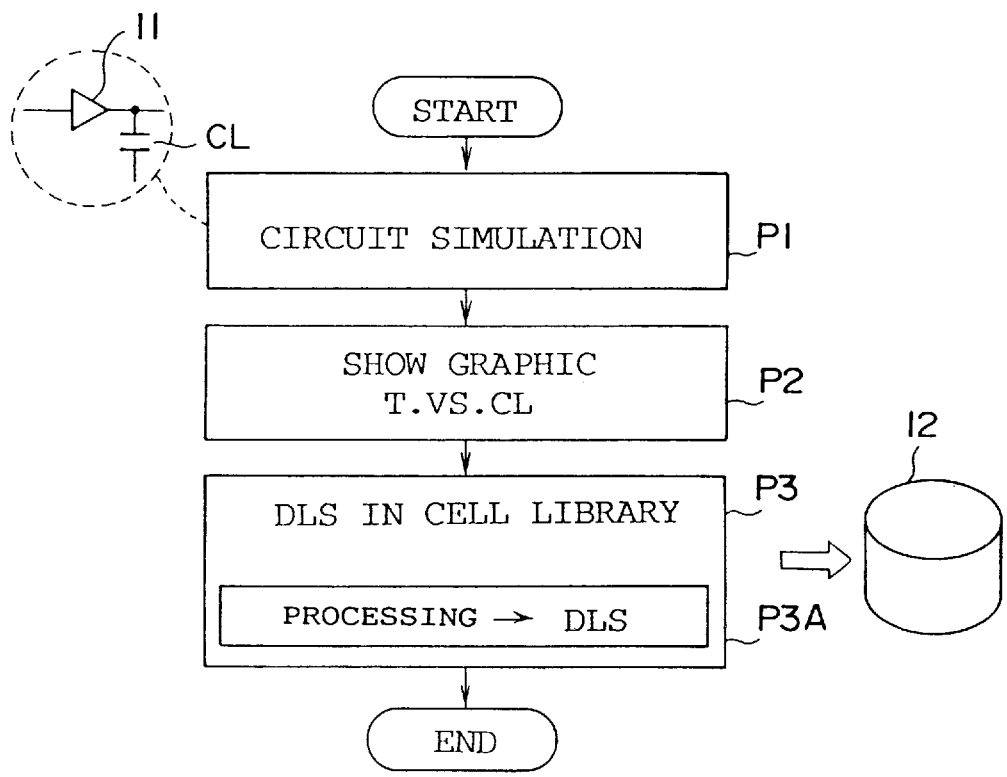
FIG. 5 is a flow chart for explaining a method of generating data in principle according to the present invention.

As against the above, according to a first method of generating data for logic calculation in principle related to the present invention, first, the input-output slew rate of a logic cell 11 and the passive element CL are made variable so as to determine a circuit calculation using the logic cell 11 and the passive element CL in a step P1 as shown in a flow chart in FIG. 5. Next, in a step P2, a plurality of relational characteristics of the operating time of the logic cell 11 versus the passive element CL obtained, based on circuit calculation, are processed to show graphical representation. Thereafter, in a step P3, the data DLS, for the logic calculations processed to show graphic representations are stored in a cell library 12.

Further, according to a second method of generating data for a logic calculation in the principle of the present invention, the data DLS for the logic calculation, to be stored in the cell library 12, are processed in a step P3A of a process flow chart shown in FIG. 5 in the first method of generating data.

Besides, in the second method of generating data according to the present invention, processing for graphic representation in which inherent operating time of the logic cell 11 is subtracted from relational characteristics of the operating time T of the logic cell 11 versus the passive element CL is performed as shown in FIG. 6 when the data DLS for logic calculation are processed.

Figure 7:
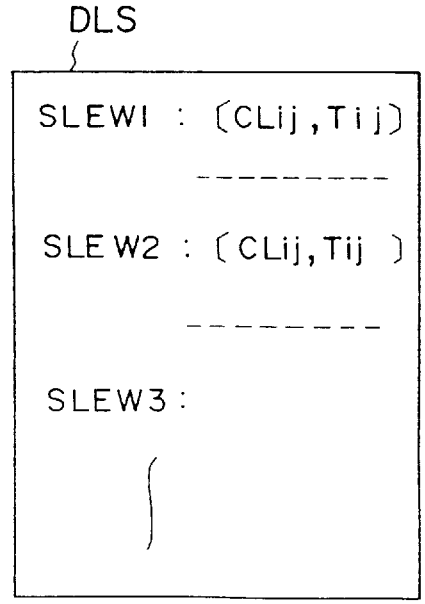
FIG. 7 is a diagram for explaining a cell library structure of the data shown in FIG. 6.

Further, in the first and the second methods of generating data according to the present invention, the data DLS for logic calculation, applied with processing to show graphic representation of relational characteristics of the operating time T (of the logic cell 11 versus the passive element CL) have relational graph data [Tij, CLij] of the operating time T of the logic cell 11 and the passive element CL. This is shown in FIG. 7 with respect to a plurality of calculation points.

Figure 8:
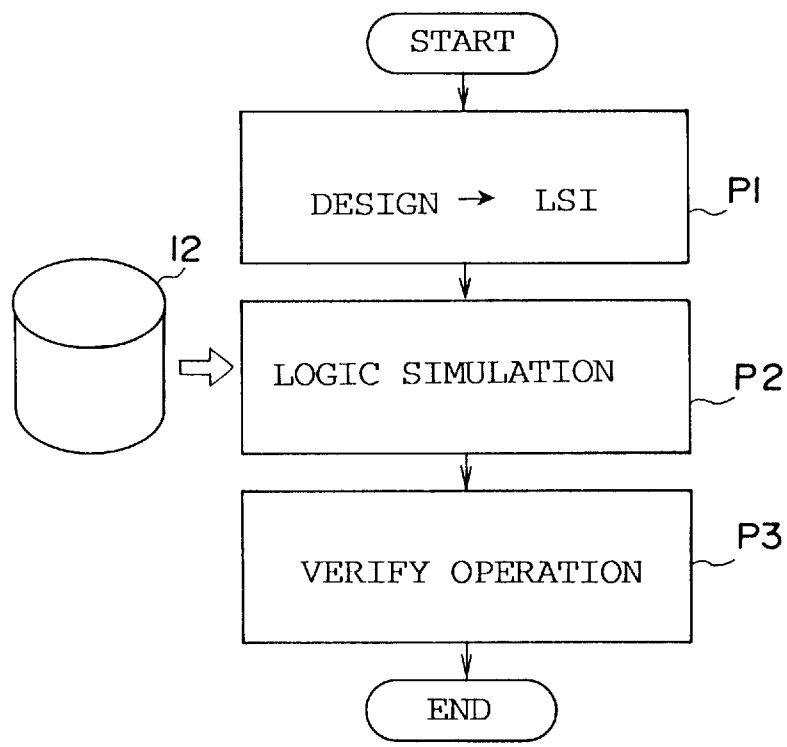
FIG. 8 is a flow chart for explaining a method of logic calculation in principle according to the present invention.

Furthermore, according to a method of logic calculation of the present invention, a semiconductor integrated circuit 13 is designed first in a step P1 as shown in a process flow chart of FIG. 8. Next, logic calculation of the semiconductor integrated circuit 13 is made based on the design in a step P2.

Then, when the operation of the semiconductor integrated circuit 13 is verified based on logic calculation in a step P3, the data DLS for logic calculation is processed to show a graphical representation of the relational characteristics of the operating time T of the logic cell 11 versus the passive element CL obtained based on circuit calculation according to the first and the second methods of generating data of the present invention.

Figure 9:
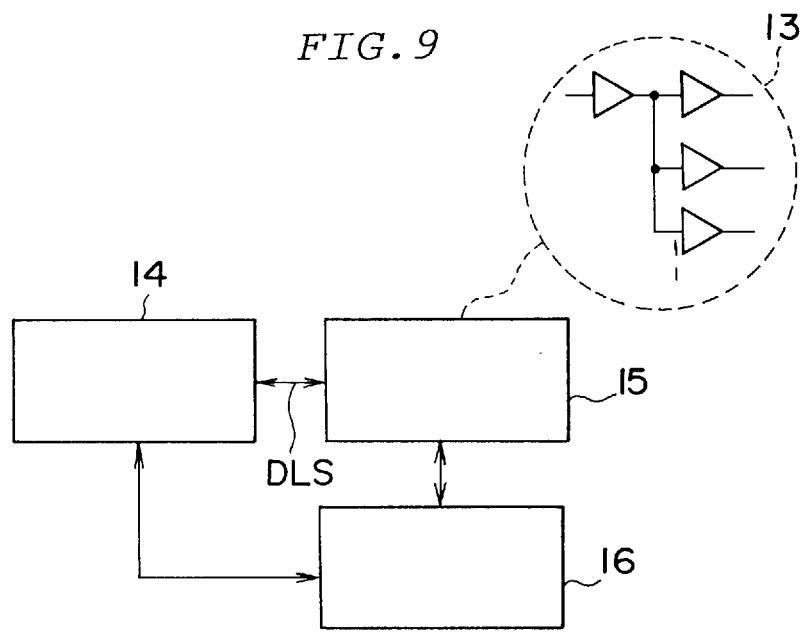
FIG. 9 is a block diagram for explaining a logic calculator in principle according to the present invention.

Further, a logic calculator of the present invention is provided with a storage means 14 in which the data DLS for logic calculation for verifying the operation of the semiconductor integrated circuit 13 are stored. An arithmetic means 15 for verifying the operation of the semiconductor integrated circuit 13 based on the data DLS for logic calculation, and control means 16 for controlling inputs-outputs of the storage means 14 and the arithmetic means 15 as shown in FIG. 9. are also provided.

Here, the data DLS for logic calculation, obtained by processing to show graphic representation of the relational characteristics of the operating time T of the logic cell 11 versus the passive element CL, obtained based on circuit calculation according to the first and the second methods of generating data, are stored in the storage means 14.

As described above, according to the first method of generating data for logic calculation of the present invention, relational characteristics of the operating time T of the logic cell 11 versus the passive element CL are processed to show a plurality of graphic representations in the step P2 as shown in the process flow chart in FIG. 5.

Figure 6A:
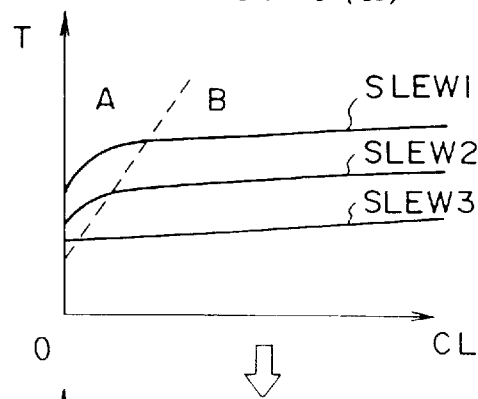
FIGS. 6(*a*) and 6(*b*) are a characteristic diagram of T versus CL for explaining a method of processing data shown in FIG. 5.
Figure 6B:
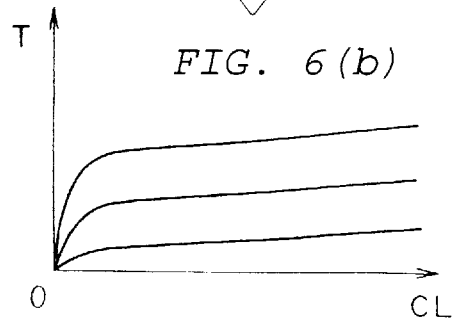

Namely, such a relational characteristic diagram of the operating time T versus the logic calculation element CL has an area A where slew rate values SLEW1, SLEW2 and SLEW3 change non-linearly and an area B where they change linearly, as shown in FIGS. 6(a) and 6(b). Further, a relational characteristic diagram of the operating time T versus the logic calculation element CL showing a characteristic having no distinction of the boundary between the areas A and B is obtained depending on the type of logic cell 11 and the input slew rate values SLEW1, SLEW2, SLEW3 . . .

As a result, it becomes possible to store the data DLS for logic calculation applied with processing to show graphic representation in the step P3, e.g., general-use graph data [Tij, Clij] showing the relationship between the operating time T of the logic cell 11 and the passive element CL such as shown in FIG. 7 in the cell library 12, with respect to a plurality of calculation points.

With this, the relational characteristics of the operating time T versus the passive element CL is no longer expressed with one line of a diagonal line graph, as in the related art of the present invention, but it becomes possible to express the operating time T of the logic cell 11 more accurately by expressing the characteristics in a plurality of relational characteristic graphs.

Further, it becomes possible to generate the data DLS for logic calculation, including the load dependent factor K, directly in the operating time T.

According to the second method of generating data of the present invention, as shown in FIGS. 6(a) and 6(b) for instance, the inherent operating time of the logic cell 11 is subtracted from the relational characteristics of the operating time T of the logic cell 11 versus the passive element CL so as to process the data DLS for logic calculation. The data are processed to show graphic representation thereof in the step P3A in the process flow chart shown in FIG. 5.

Thus, it is possible to divide the results of circuit calculation, obtained for each logic cell 11 and each transistor path, into a common portion of the logic cell 11 and an inherent operating time portion of the logic cell 11, by setting the conditions of the passive element CL and the slew rate values SLEW1, SLEW2, SLEW3, . . .

For example, intercepts of the inherent operating time of the logic cell 11 (points where relational characteristics of the operating time T versus the passive element CL cross an operating time T axis) are subtracted from the operating time T for a plurality of slew rate values SLEW1, SLEW2, SLEW3, . . . With this, it is possible to divide the data into portions where the load capacity Clij and the operating time Tij for respective calculation points are described and portions where the title of the logic cell 11, the values of intercepts of the inherent operating time with respect to a plurality of slew rate values SLEW1, SLEW2, SLEW3, . . ., and graph part name, for facilitating graph selection, are described as the inherent descriptive portion of each logic cell 11. As a result, the relational characteristics of the operating time T of a plurality of logic cells 11 having different conditions versus the passive element CL are made common to one another.

With this, it becomes possible to aim at a reduction of the memory capacity of the cell library 12 as compared with the first method of generating data in which the circuit calculation results are stored in the cell library 12 as is.

Furthermore, according to the method of logic calculation of the present invention, the data DLS for logic calculation, obtained based on the first and the second methods of generating data of the present invention, are used in a step P2 as shown in a process flow chart in FIG. 8.

Thus, it becomes possible to verify the operation of the semiconductor integrated circuit 13 accurately, based on the data DLS for logic calculation in a step P3, by directly using the data DLS for logic calculation (based on the relational characteristics of the operating time T of the logic cell 11 versus the passive element CL obtained based on circuit calculation) even when a new LSI is to designed. This achieves super fineness and densification in accordance with the requirement for high integration and densification of an LSI device.

With this, it is possible to make accurate logic calculation of the influence by the slew rate values SLEW1, SLEW2, SLEW3, . . . exerted on the logic cell at the next stage by the logic calculation element CL, thus making it possible to design a highly precise semiconductor integrated circuit 13.

Here, the operation of the logic calculator in principle according to the present invention will be described. For example, as shown in FIG. 9, when the data DLS for logic calculation are read out of the storage means 14 through the control means 16, the operation of the semiconductor integrated circuit 13 is verified by the arithmetic means 15 based on the data DLS for logic calculation.

Thus, it is possible to utilize the data DLS for logic calculation obtained, based on circuit calculation as reference data of relational characteristics of the operating time T versus the passive element CL of the semiconductor integrated circuit 13, attendant upon new developments.

With this, it becomes possible to make highly precise logic calculations of diversified semiconductor integrated circuit 13 by using the data DLS for logic calculation directly in a logic calculator, which contributes greatly to improvement of performance and reliability of the logic calculator concerned.

Next, preferred embodiments of the present invention will be described with reference to the drawings.

(1) Description of the first preferred embodiment

Figure 10:
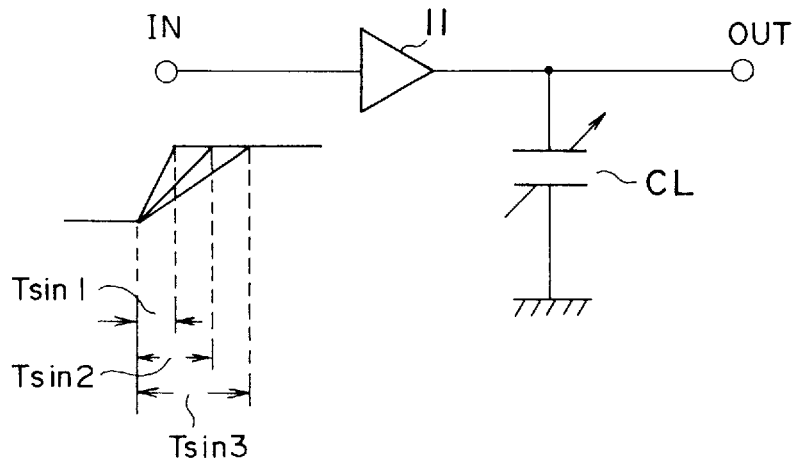
FIG. 10 is a block diagram of a circuit calculation model expressing delay time of a logic cell according to a first preferred embodiment of the present invention.
Figure 11:
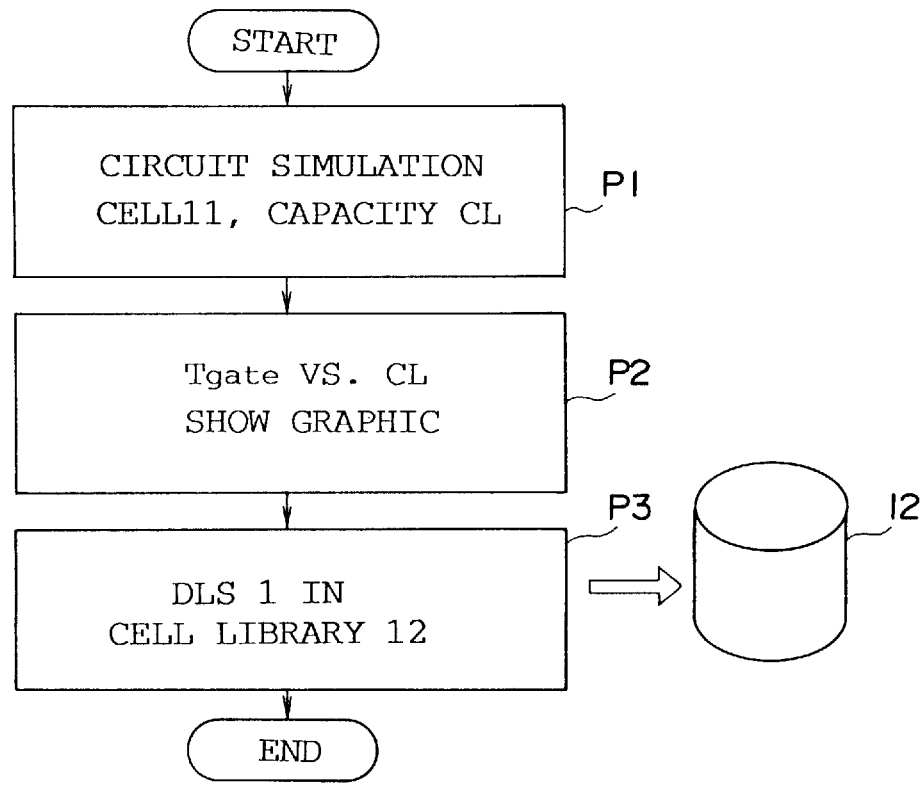
FIG. 11 is a flow chart for explaining a method of generating data for logic calculation according to the first preferred embodiment of the present invention.

For example, when the data DLS for logic calculation are generated using a circuit calculation model, such as shown in FIG. 10, circuit calculation is made first by varying the input slew rate and the load capacity CL of the logic cell 11 in a step P1 in a flow chart shown in FIG. 11.

Here, a circuit calculation model has a logic cell 11 and a load capacity CL as shown in FIG. 10. The load capacity CL is connected to an output portion OUT of the logic cell 11. Further, signals of the input slew rates Tsin1, Tsin2 and Tsin3 are supplied to an input portion IN of the logic cell 11. With this, circuit calculation of the delay time is made when the load capacity CL is varied with respect to slew rate values SLEW1, SLEW2 and SLEW3.

Next, a plurality of relational characteristics of delay time Tgate of the logic cell 11 versus load capacity CL (obtained from circuit calculation) are processed to show graphic representations in a step P2. Here, since the delay time Tgate of the logic cell 11 differs depending on the value of the load capacity CL and the slew rate values SLEW1, SLEW2 and SLEW3, circuit calculation is made by setting these conditions. Then, a relational characteristic graph such as that shown in FIG. 12A (hereinafter referred to also as a piece-wise graph) is obtainable.

In FIG. 12A, the axis ordinate shows the delay time Tgate and the abscissa axis shows the load capacity CL, respectively. Further, an input slew rate Tsin shows slew rate values SLEW1, SLEW2 and SLEW3, and black circle marks show calculation points, respectively.

Thereafter, data DLS1 for logic calculations processed to show graphic representations are stored in the cell library 12 in a step P3. At this time, the delay time Tgate of the logic cell 11 versus the load capacity CL is adapted to a cell library structure of a graph form of the present invention. Then, the data are generated as data DLS1 for logic calculation such as that shown in FIG. 12B. These data DLS1 are general-use graph data [Tij, Clij] showing the relationship between the delay time Tgateij of the logic cell 11 and the load capacity CL, and correspond to a plurality of calculation points on the piece-wise graph.

Referring to the data contents of the cell library 12, the load capacity Clij and the delay time Tgateij at each calculation point are extracted for the slew rate values SLEW1, SLEW2 and SLEW3 as shown in FIG. 12B. For example, [CL11, Tgate11], [CL12, Tgate12], [CL13, Tgate13] . . . with respect to the slew rate value SLEW1, [CL21, Tgate21], [CL22, Tgate22], [CL23, Tgate23] . . . with respect to the slew rate SLEW2, and [CL31, Tgate31], [CL32, Tgate32], [CL33, Tgate33] . . . with respect to the slew rate value SLEW3 are described.

Further, the proper title of the graph, the input slew rate values SLEW1, SLEW2, SLEW3, . . . , the load capacity CL, the delay time Tgate of the logic cell 11 or the like are described therein. Besides, the piece-wise graph is in existence in each up/down operation and path of the logic cell and can be increased by as many units as one likes by changing the title of the graph.

This system is capable of assembling not only the delay time of the logic cell 11, but also all of the non-linear data in a library form. The data between respective calculation points can be computed by interpolation. Therefore, it is sufficient to set calculation points to make a library form so that the precision of the data DLS1 for logic calculation is satisfied.

In such a manner, according to a method of generating data for logic calculation related to the first embodiment of the present invention, the delay time Tgate of the logic cell 11 versus the load capacity CL is processed so as to show piece-wise graphic representation based on circuit calculation obtained by varying the input-output slew rate of the logic cell 11, and the load capacity CL in the step P2 as shown in a process flow chart in FIG. 11.

As a result, it becomes possible to obtain such piece-wise graphs of the delay time Tgate versus the load capacity CL that an area A where the slew rate values SLEW1, SLEW2 and SLEW3 change non-linearly and an area B where they change linearly are in existence as shown in FIG. 12A. This fact makes it possible to store the data DLS1 for logic calculation processed to show graphic representation in the step P3 in the cell library 12 as general-use graph data [Tij, Clij] showing the relation ship between the delay time Tgate of the logic cell 11 and the load capacity CL such as shown in FIG. 12B with respect to a plurality of calculation points, for instance.

With this, the relational characteristics of the delay time Tgate versus the load capacity CL can no longer be expressed with one line of a polygonal line graph as in the related art of the present invention. It then becomes possible to express the delay time Tgate of the logic cell 11 more accurately by expressing the relational characteristics with a plurality of piece-wise graphs. Further, it becomes possible to generate the data DLS1 for logic calculation including a load dependent factor K as in the related art of the present invention directly in the delay time Tgate.

Next, the structure and the operation of a logic calculator using the data DLS1 for logic calculation will be described.

Figure 13:
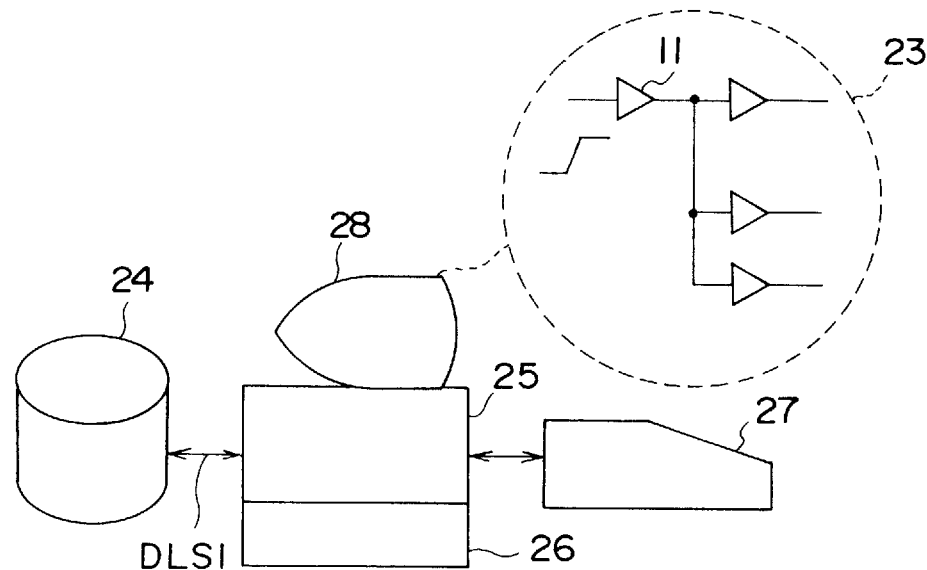
FIG. 13 is a block diagram of a logic calculator according to respective preferred embodiments of the present invention.

For example, a logic calculator using the data DLS1 for logic calculation is provided with a memory disk unit 24, an operation verifying editor 25, a central arithmetic and processing unit (hereinafter referred to as a CPU) 26, a keyboard 27 and a display 28, as shown in FIG. 13.

Namely, the memory disk unit 24 is an example of the storage means 14, and stores the data DLS1 for logic calculation for verifying the operation of a new semiconductor integrated circuit 13 (hereinafter referred to simply as an LSI 23). For example, a magnetic disk unit or a semiconductor memory disk unit is used for the memory disk unit 24.

Further, the data DLS1 for logic calculation obtained by the method of generating data according to the first embodiment are stored in the memory disk unit 24. The data DLS1 concerned are obtained by processing relational characteristics of the delay time Tgate of the logic cell 11 versus the load capacity CL to show graphic representation.

The operation verifying editor 25 is an example of the arithmetic means 15, and verifies the operation of the LSI 23 based on the data DLS1 for logic calculation. For example, the operation verifying editor 25 computes the delay time between input and output of a predesignated logic cell in the LSI 23 using the data DLS1 for logic calculation. The LSI 23 is formed by combining a plurality of logic cells.

The CPU 26 is an example of the control means 16, and controls the input-output of the memory disk unit 24, the operation verifying editor 25, the keyboard 27 and the display 28. For example, the CPU 26 controls readout of the data DLS1 for logic calculation from the memory disk unit 24.

The keyboard 27 is auxiliary equipment of the CPU 26 and inputs control statements or various external data, and the display 28 displays a circuit diagram of the LSI 23 and the contents of data DLS1 for logic calculation.

In this manner, according to a logic calculator related to respective embodiments of the present invention, there are provided the memory disk unit 24, the operation verifying editor 25, the CPU 26, the keyboard 27 and the display 28 as shown in FIG. 13, and the data DLS1 for logic calculation obtained by the first method of generating data of the present invention are stored in the memory disk unit 24.

As a result, when a user inputs external data such as control statements through the keyboard 27, the data DLS1 for logic calculation are read out of the memory disk unit 24 through the CPU 26, and the operation of the LSI 23 is verified by the operation verifying editor 25 using the data DLS1 for logic calculation. Thus, it is possible to utilize the data DLS1 for logic calculation obtained from the circuit calculation as the reference data of relational characteristics of the delay time Tgate of the LSI 23 versus the load capacity CL attendant upon new development.

With this, it becomes possible to make highly precise logic calculation of versified LSI 23 by using the data DLS1 for logic calculation directly in a logic calculator, which contributes greatly to improvement of performance and reliability of the logic calculator concerned.

Next, a method of logic calculation according to respective embodiments of the present invention will be described with reference to a process flow chart in FIG. 14 while supplementing the operation of the unit concerned.

Figure 14:
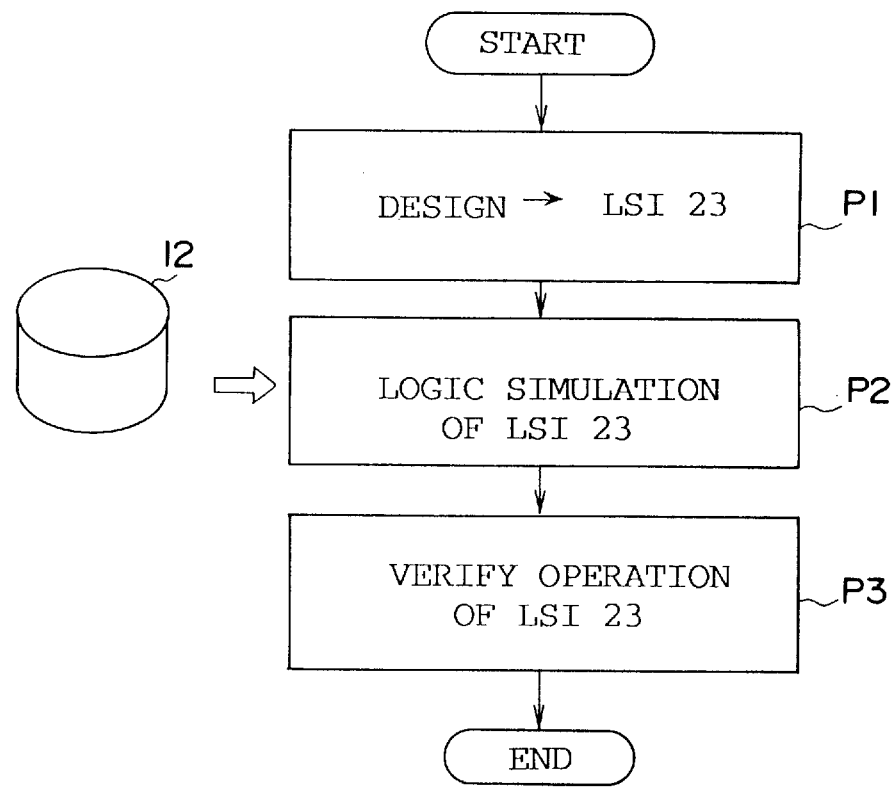
FIG. 14 is a flow chart for explaining a method of logic calculation according to respective preferred embodiments of the present invention.

For example, when the operation of the LSI 23 shown in a broken line circle in FIG. 13 is verified, the LSI 23 is designed first in a step P1 in FIG. 14. At this time, a user designs a new LSI 23 by combining the logic cells 11 in accordance with predetermined design conditions.

Next, logic calculation of the LSI 23 is made in a step P2. AT this time, for example, the cell library (the data DLS1 for logic calculation) obtained based on the method of generating data for logic calculation according to the first embodiment of the present invention is used as it is. To be concrete, the data DLS1 for logic calculation are controlled to be transferred from the memory disk unit 24 to the operation verifying editor 25 through the CPU 26. Here, the data DLS1 for logic calculation are read out of the memory disk unit 24.

Further, the circuit diagram of the LSI 23 and the contents of the data DLS1 for logic calculation are displayed on the display 28. The operation verifying editor 25 verifies the operation of the LSI 23 using the data DLS1 for logic calculation. For example, the operation verifying editor 25 computes the delay time between the input and the output of a pre-designated logic cell in the LSI 23 formed by combining a plurality of logic cells. Besides, in the case of corresponding to an intermediate point of a description value of the cell library 12, the operation verifying editor 25 computes the delay time at that intermediate point by interpolation. Here, the description values of the cell library 12 are the load capacity CL and input slew rate values SLEW1, SLEW2 and SLEW3 required for computing delay in the logic calculation.

Then, the operation of the LSI 23 is verified by logic calculation in a step P3. Here, a user designates an input net and an output net of the logic cell 11 of the LSI 23 through the keyboard 27 and verifies the operation thereof.

In this manner, according to the method of logic calculation related to respective embodiments of the present invention, the data DLS1 for logic calculation obtained by the first method of generating data of the present invention are used when logic calculation of the LSI 23 is made in the step P2, as shown in the process flow chart in FIG. 14.

Thus, it becomes possible to verify the operation of the LSI 23 accurately using the data DLS1 concerned in the step P3 by using the data DLS1 for logic calculation obtained based on the circuit calculation directly even when a new LSI is designed so as to achieve super fineness and densification in accordance with the requirement for high integration and densification of the LSI unit.

With this, it becomes possible to make accurate logic calculation of the influence by the slew rate values SLEW1, SLEW2 and SLEW3 applied to a logic cell at a next stage of the load capacity CL, and to design a highly precise semiconductor integrated circuit.

(2) Description of the second preferred embodiment

Figure 16A:
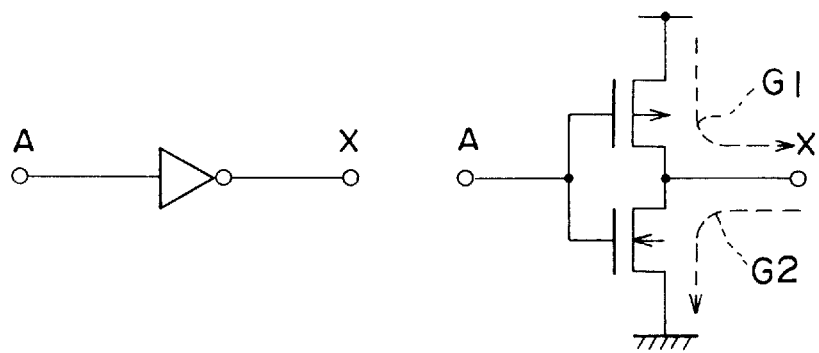
FIG. 16A is a block diagram of a circuit calculation model (inverter) for supplementing the flow chart shown in FIG. 15.

What differs from the first embodiment is the fact that the data DLS1 for logic calculation to be stored in the cell library 12 are processed in a second embodiment. A method of processing data DLS for logic calculation applicable to verification of operation of an inverter circuit, a two-input NAND circuit and a two-input NOR circuit such as shown in FIG. 16A to FIG. 16C will be described.

Figure 15:
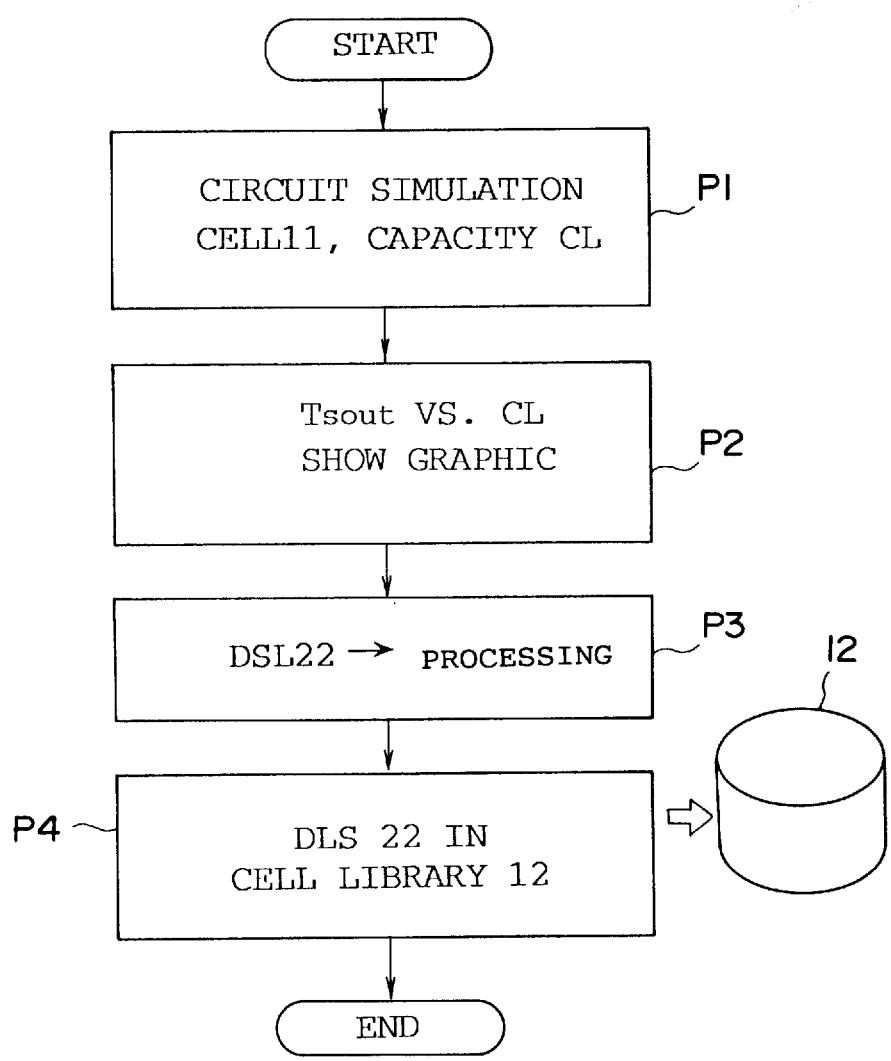
FIG. 15 is a flow chart for explaining a method of generating data for logic calculation according to a second preferred embodiment of the present invention.

Namely, circuit calculation is made first by varying the input-output slew rate of the inverter circuit and the load capacity CL in a step P1 of a flow chart shown in FIG. 15. Here, similar to the first embodiment, signals of input slew rates Tsin1, Tsin2 and Tsin3 are supplied to an input portion A of an inverter circuit such as that shown in FIG. 16A, and circuit calculation on the delay time when the load capacity CL is varied with respect to the slew rate values SLEW1, SLEW2 and SLEW3 is made. To be concrete, two characteristic graphs G1 and G2 are obtained. The characteristic graph G1 shows a case in which a transistor TP charges the load capacity, and the characteristic graph G2 shows a case in which a transistor TN extracts electric charges from the load capacity.

Figure 16B:
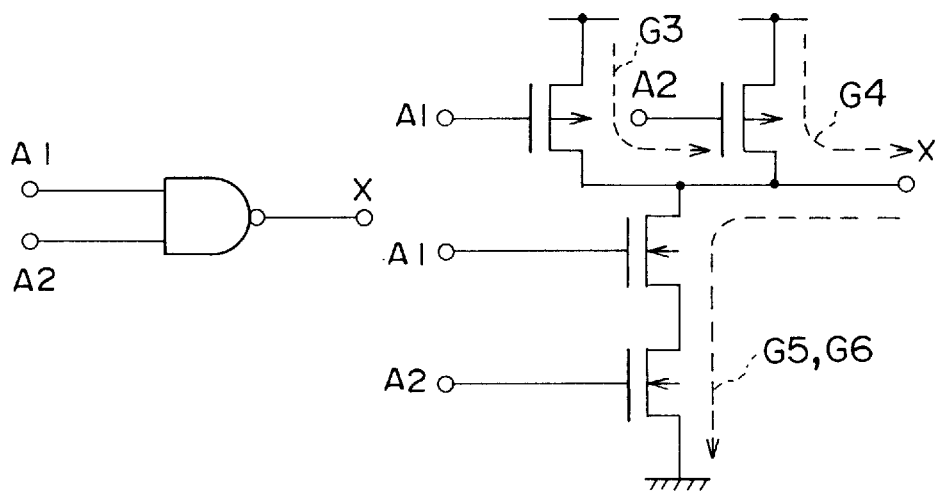
FIG. 16B is a block diagram of a circuit calculation model (two-input NAND circuit) for supplementing the flow chart shown in FIG. 15.

Four characteristic graphs G3 to G6 are obtainable with respect to such a two-input NAND circuit as shown in FIG. 16B. The graph G3 shows a case in which a transistor TP1 charges the load capacity, and the graph G4 shows a case in which a transistor TP2 charges the load capacity in a similar manner. The graph G5 shows a case in which a transistor TN1 extracts electric charges from the load capacity, and the graph G6 shows a case in which a transistor TN2 extracts electric charges from the load capacity in a similar manner.

Figure 16C:
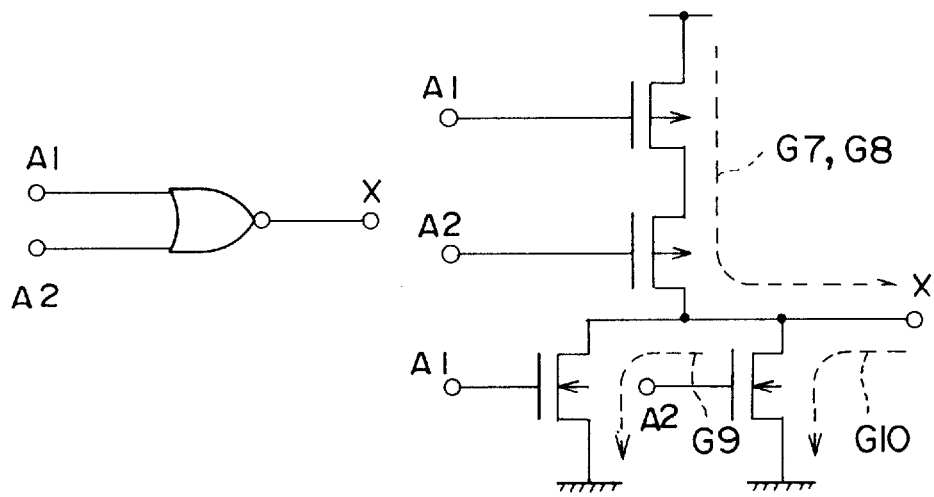
FIG. 16C is a block diagram of a circuit calculation model (two-input NOR circuit) for supplementing the flow chart shown in FIG. 15.

Four characteristic graphs G7 to G10 are also obtainable with respect to such a two-input NOR circuit as shown in FIG. 16C. The graph G7 shows a case in which the transistor TP1 charges the load capacity, and similarly, the graph G8 shows a case in which the transistor TP2 charges the load capacity. The graph G9 shows a case in which the transistor TN1 extracts electric charges from the load capacity, and the graph G10 shows a case in which the transistor TN2 extracts electric charges from the load capacity in a similar manner.

Next, a plurality of relational characteristics of an increment Tout of delay time due to the load of an inverter circuit, a two-input NAND circuit and a two-input NOR circuit obtained by circuit calculation versus the load capacity CL, are processed to show graphic representation in a step P2. Here, in the first embodiment, the result of circuit calculation has been made to be held in the cell library 12 as it is, in order to reproduce the influence of the load capacity CL and the input slew rate values SLEW1, SLEW2 and SLEW3 exerted upon the delay time Tgate of the inverter circuit most faithfully.

However, when conditions of the load capacity CL and the input slew rate values SLEW1, SLEW2 and SLEW3 are set, and calculation results in each cell and in each path are stored in the cell library 12 as they are as the first embodiment, the memory capacity of the cell library 12 is increased. Therefore, more memory capacity of the cell library 12 becomes required in a custom LSI having several hundred types of inverter circuits.

Accordingly, the data DLS for logic calculation to be stored in the cell library 12 are processed in a step P3 in the second embodiment. At this time, processing to show graphic representation in which the increment Tout of the delay time due to the inherent load of the inverter circuit is subtracted from the relational characteristics of the increment Tout of the delay time, due to the load of the inverter circuit versus the load capacity CL, is performed. Besides, the delay time Tgate of such an inverter circuit as shown in FIG. 16A is expressed by a time equation (3), which is a modification of the expression (1), that is:

$$Tgate = T0 + Tout \qquad (3)$$

Here, Tgate represents an increment of the delay time due to the load of the logic cell. T0 represents the delay time of a cell at a time of no load, and is different in each cell and in each path. Tout represents an increment due to the load, and is an element determined to some extent depending on a structure of the cell and a transistor configuration at the output stage.

To be concrete, since the increment Tout of the delay time due to the load of the inverter circuit is different depending on the value of the load capacity CL and the slew rate values SLEW1, SLEW2 and SLEW3, circuit calculation is made by setting these conditions.

Figure 17A:
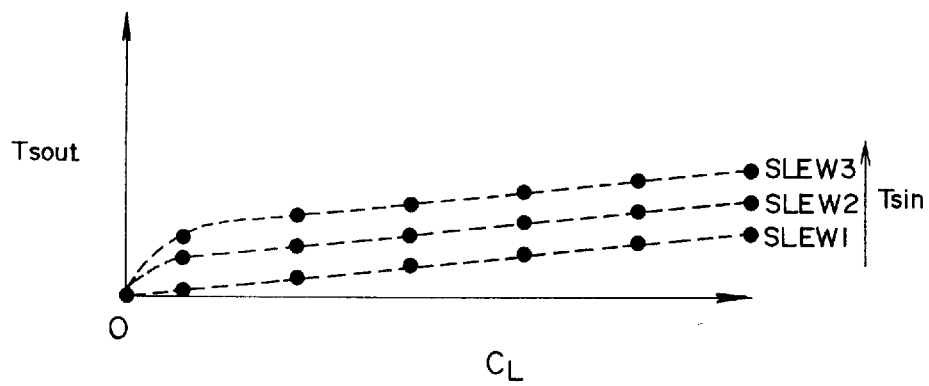
FIG. 17A is a characteristic diagram of Tout versus CL of the circuit calculation model shown in FIG. 15.

As shown in FIG. 17A, when the increment of the delay time due to the load of the inverter circuit versus the load capacity CL is applied to the cell library structure of a graph form of the present invention, data DLS22 for logic calculation are generated. These data DLS22 are general-use graph data [Tij, Clij] showing the relationship between the increment Tout of the delay time to the load of the inverter circuit and the load capacity CL, and correspond to a plurality of calculation points on the piece-wise graph.

In FIG. 17A, the ordinate axis represents the increment Tout of the delay time due to the load, and the abscissa axis represents the load capacity CL, respectively. Further, an input slew rate Tsin shows the slew rate values SLEW1, SLEW2 and SLEW3, and black circle marks show calculation points, respectively.

Namely, in the second embodiment of the present invention, the data DLS22 are divided into an inherent portion related to the data DLS22 for logic calculation of the inverter circuit and a communization portion. Thus, the characteristic graph such as that shown in FIG. 12A is changed into a piece-wise graph in which Y intercepts showing time variation portions in the case of slew rate values SLEW1, SLEW2 and SLEW3 such as shown in FIG. 17A, e.g. (T01, T02, T03 . . . ) are subtracted.

Here, the Y intercept is a point where the relational characteristics of the increment Tout of the delay time, (due to the load versus the load capacity CL) cross the Tout axis, and is to shows the time variation portion of a logic cell, as an active element or the like. Further, the data contents of the cell library 12 are obtained by extracting the load capacity Clij and the increment Toutij of the delay time due to the load at each calculation point with respect to the slew rate values SLEW1, SLEW2 and SLEW3 as shown in FIG. 17A.

Figure 17B:
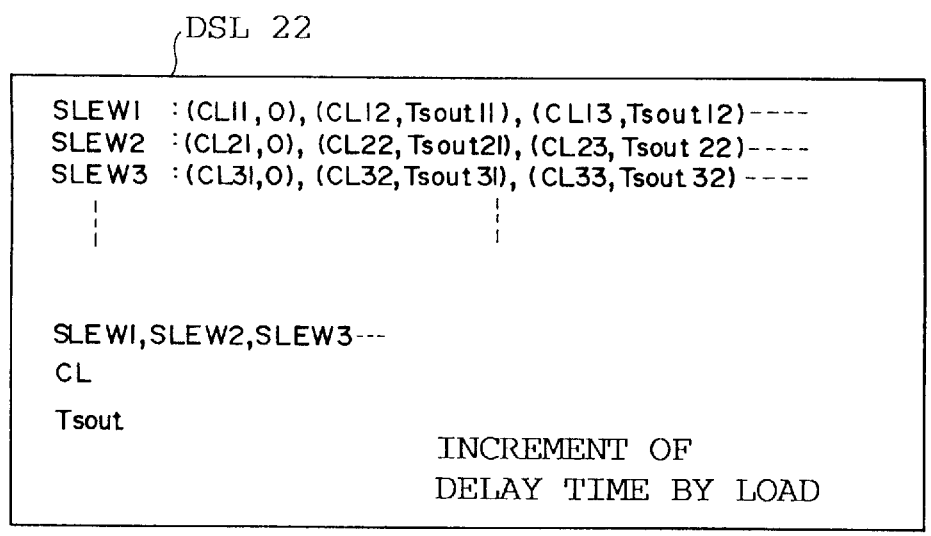
FIG. 17B is a diagram for explaining a cell library structure of the circuit calculation model shown in FIG. 15.

An example that these graph data are formed in a cell library is shown in FIG. 17B. For example, as shown in FIG. 17B, [CL11, 0], [CL12, Tout11], [CL13, Tout12] . . . for the slew rate value SLEW1, [CL21, 0], [CL22, Tout21], [CL23, Tout22] . . . for the slew rate value SLEW2, and [CL31, 0], [CL32, Tout31], [CL33, Tout32] for the slew rate value SLEW3 are described, respectively.

Further, the input slew rate values SLEW1, SLEW2, SLEW3, . . . , the load capacity CL, and the increment Tout of the delay time of the load of the inverter circuit are described in the cell library, and it is possible to process graph data with type classification of an inverter circuit, a two-input NAND circuit, a two-input NOR circuit or the like, or software for comparing respective points and so on by forming the library structure as described above.

In the embodiment of the present invention, the characteristic graph G1 for the inverter circuit and the characteristic graphs G3 and G4 of the two-input NAND circuit are processed into one. The characteristic graph G2 and the characteristic graphs G9 and G10 of the two-input NOR circuit are processed into one. Further, the characteristic graphs G5 and G6 of the two-input NAND circuit are processed into one, and the characteristic graphs G7 and G8 of the two-input NOR circuit are processed into one.

Thereafter, the data DLS22 for logic calculation processed in a step P4 in the process flow chart shown in FIG. 15 are stored in the cell library 12. At this time, since no graphic data in each cell are not in existence after data processing, it is required to give titles such as an inverter circuit, a two-input NAND circuit, a two-input NOR circuit in the graph and to describe which graph each cell has to refer to in the cell library 12 as parameters.

FIG. 17C shows the contents of the data DLS22 for logic calculation having the library structure concerned. The data contents of the cell library include a piece-wise graph data part portion and a descriptive portion inherent to the cell as shown in FIG. 17C. The load capacity Clij and the increment Toutij of the delay time with respect to the slew rate values SLEW1, SLEW2, SLEW3, . . . are described in the part portion. The increment Toutij of the delay time is communized after subtracting Y intercepts (T01, T02, T03, . . . ). The load capacity Clij is described at each calculation point. The increment Toutij of the delay time depends on the load.

Further, T01=0000, T02=1111, T03=3333 . . . are described for instance as inherent Y intercept values with respect to the slew rate values SLEW1, SLEW2, SLEW3, . . . in the descriptive portion inherent to the cell, and graph part names are described in order to facilitate graph selection. To be concrete, an inverter circuit, a two-input NAND circuit, a two-input NOR circuit or the like are described in the cell title portion, and inherent Y intercepts (T01, T02, T03, . . . ) and the graph part names with respect to slew rate values SLEW1, SLEW2, SLEW3, . . . of respective circuits are described at a lower part of the title.

Thus, according to the method of generating data for logic calculation related to the second preferred embodiment of the present invention, the data DLS22 for logic calculation to be stored in the cell library 12 are processed in the step P3 of the process flow chart shown in FIG. 15.

Thus, it is possible to divide the result of circuit calculation obtained in each transistor path of respective inverter circuits, two-input NAND circuits and two-input NOR circuits into a common portion of these circuits and an element portion of the increment Tout of the delay time of the load inherent to each circuit by setting the conditions of the load capacity CL and the input slew rate values SLEW1, SLEW2, SLEW3, . . .

With this, the characteristic graphs are processed into four sheets in the second embodiment as compared with the first embodiment. Namely, ten sheets of characteristic graphs G1 to G3 become necessary for verifying logically the inverter circuit, the two-input NAND circuit and the two-input NOR circuit in the first embodiment. In the second embodiment, the characteristic graphs G1=G3=G4 are processed into one, and the characteristic graphs G2=G9=G10 are processed into one. Further, the characteristic graphs G5=G6 are processed into one, and the characteristic graphs G7=G8 are processed into one, respectively.

With this, it becomes possible to aim at a reduction of the memory capacity of the cell library 12 as compared with the first method of generating data in which the results of circuit calculation are stored in the cell library 12 as is.

(3) Description of the third preferred embodiment

Being different from the second embodiment, the data for logic calculation taking the input slew rates into consideration are generated, which are formed in a cell library structure in a third preferred embodiment of the present invention.

Figure 18:
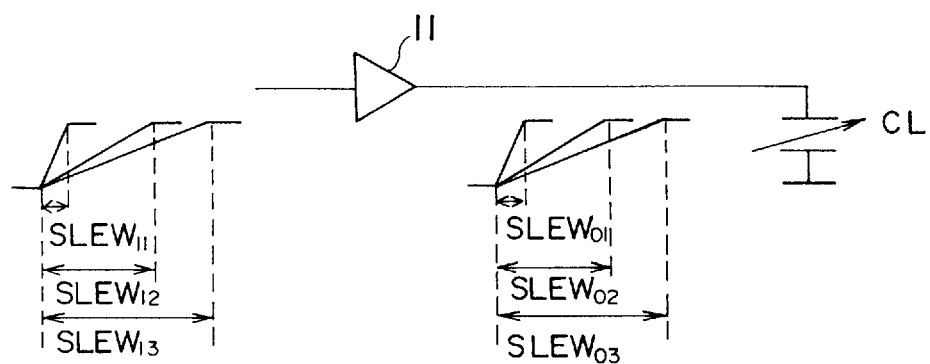
FIG. 18 is a block diagram of a circuit calculation model for explaining a method of generating data for logic calculation according to a third preferred embodiment of the present invention.

For example, when logic calculation is made while taking input slew rate values SLEW11, SLEW12 and SLEW13 of a circuit calculation model such as shown in FIG. 18 into consideration, it is required to compute slew rate values SLEW11, SLEW12 and SLEW13 which are inputted to the logic cell 11. However, the foregoing becomes possible by circuit calculation of the load dependency of slew rate values SLEW01, SLEW02 and SLEW03 of the cell 11 concerned.

Besides, this parameter (output slew rate TS0) can be processed similarly to the increment Tsout of the delay time of the load of the logic cell 11 versus the load capacity CL. Namely, the output slew rate values SLEW01, SLEW02 and SLEW03 of the logic cell 11 change depending on the output capacity and the input slew rate values SLEW11, SLEW12 and SLEW13.

Hereupon, circuit calculation of a circuit model such as that shown in FIG. 18 is made, thereby to acquire the load dependency of the output slew rate values SLEW01, SLEW02 and SLEW03 on respective slew rate values SLEW11, SLEW12 and SLEW13. With this, it becomes possible to acquire the output slew rate TS0 similarly to the load dependency of the increment of the delay time due to the load.

Figure 19A:
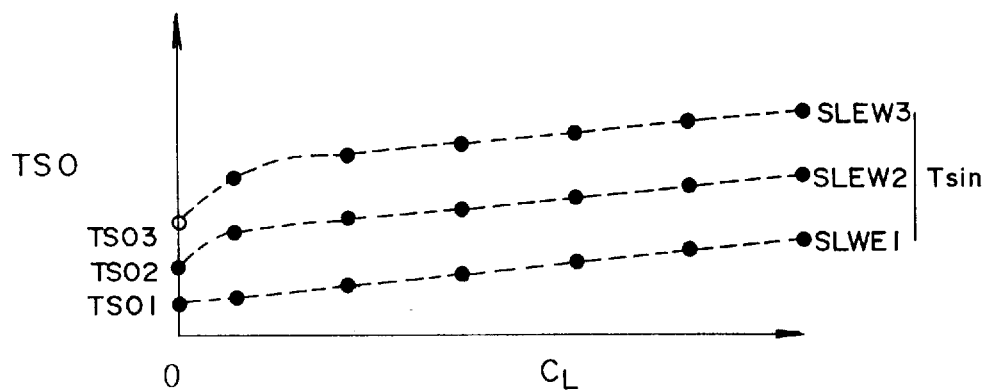
FIG. 19A is a characteristic diagram of TSO versus CL of the circuit calculation model shown in FIG. 18.

The result of calculation is shown in FIG. 19A. In FIG. 19A, the ordinate axis represents an output slew rate TS0, and the abscissa axis represents a load capacity CL, respectively. Further, the input slew rate Tsin shows slew rate values SLEW1, SLEW2 and SLEW3, and the black circle marks show calculation points, respectively.

In order to apply this result to the cell library structure of a graph form of the present invention, the data are divided into an inherent portion and communizable portion of the logic cell 11. For example, in the case of respective slew rate values SLEW1, SLEW2 and SLEW3, the structure is transformed into a shape formed by subtracting values of intercepts (TS01, TS02, TS03, . . . ) of the output slew rate TS0 from the output slew rate TS0.

Figures 19B, 19C:
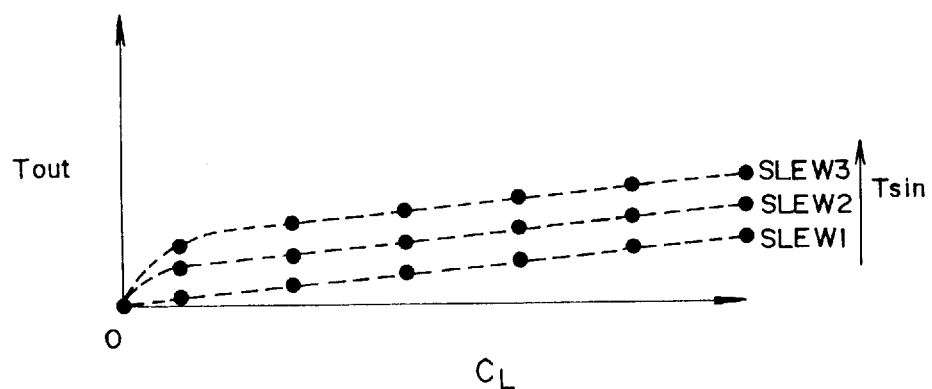
FIG. 19B is a characteristic diagram of Tsout versus CL after data processing of the circuit calculation model shown in FIG. 18.
FIG. 19C is a diagram for explaining a cell library structure after the data processing of the circuit calculation model shown in FIG. 18.

The result thereof is shown in FIG. 19B. Here, the axis of ordinates represents the increment Tsout of the output slew rate due to the load, and the axis of abscissas represents the load capacity CL, respectively. Further, the input slew rate Tsin shows slew rate values SLEW1, SLEW2 and SLEW3 and the black circle marks show calculation points, respectively.

When this result is applied to a library structure of a graph form, it appears as shown in FIG. 19C. The contents of the data DLS23 for logic calculation of the cell library 12 include a piece-wise graph data part portion and a descriptive part inherent to the cell. In the part portion, the load capacity Clij at each calculation point communized for the slew rate values SLEW1, SLEW2 and SLEW3 and the increment Tsoutij of the output slew rate due to the load are described, respectively.

For example, as shown in FIG. 19C, [CL11, 0], [CL12, Tsout11], [CL13, Tsout12] . . . for the slew rate value SLEW1, [CL21, 0], [CL22, Tsout21], [CL23, Tsout22] . . . for the slew rate value SLEW2 and [CL31, 0], [CL32, Tsout31], [CL33, Tsout32] . . . for the slew rate value SLEW3 are described, respectively.

Further, in the descriptive portion inherent to the cell, for instance, the input slew rate values SLEW1, SLEW2, SLEW3 or the like are described, and the load capacity CL and the increment Tout of the output slew rate due to the load are described. Besides, T01, T02, T03 . . . are described as the values of inherent Y intercepts for the slew rate values SLEW1, SLEW2, SLEW3, . . .

It becomes possible to process the data DLS23 for logic calculation similarly to the second embodiment by performing such data processing.

With this, it becomes possible to aim at a reduction of the memory capacity of the cell library 12 similar to the second and the third embodiments as compared with the first embodiment in which the result of circuit calculation is stored in the cell library 12 as it is.

What is claimed is:

1. A method of generating general-use graph data for a plurality of different types of logic cells, comprising the steps of:

executing circuit simulations for plural types of logic cells, each of the plural types corresponding to a plurality of inner circuits having corresponding different structures, by changing a delay time after a signal is inputted into a respective logic cell until the signal is outputted from the logic cell and changing a load capacity and/or transient time of the inputted signal for the logic cell, to acquire graph data in the form of a plurality of relational graphs each corresponding to a respective slew rate for the logic cell;

processing said plurality of relational graphs into characteristic data having an origin at a common value; and comparing the characteristic data each logic cell with one another to find characteristic data having a similar characteristic, wherein the found characteristic data is used as general-use graph data.

2. A method of generating data according to claim 1, wherein a first type of logic cell of said plural types of logic cells includes an active circuit element.

3. A method of generating data according to claim 2, wherein a second type of logic cell of said plural types of logic cells includes a passive circuit element.

4. A method of generating data according to claim 3, wherein the plurality of relational graphs acquired from said simulations show the relationship of an operating time of the second type of logic cell with said passive element.

5. A method of generating data according to claim 4, wherein the plurality of relational graphs acquired from said simulations show the relationship of the operating time of the first type of logic cell with said active element.

6. A method of generating data according to claim 5, wherein the plurality of relational graphs acquired from said simulations show the relationship of the operating time of the active element with the passive element.

7. A method of logic calculation comprising the steps of:

determining an object cell as an object of calculation;

acquiring graph data corresponding to said object cell from a library possessing graph data in the form of a plurality of relational graphs of standard delay times having a common origin with respect to each of a plurality of corresponding logic cells; and setting an inherent condition of said object cell by adding an inherent delay time with said acquired graph data.

8. A method of logic calculation according to claim 7, wherein:

said logic cell includes a generic-circuit which is connected to a second logic cell; and a delay time required to operate said generic-circuit is calculated by using output information from said second logic cell.

9. A method of logic calculation according to claim 8, wherein said delay time is information of a transient time of a signal inputted to a front stage of the logic cell which is an object of calculation.

10. A method of logic calculation according to claim 8, wherein information outputted from a generic-circuit is calculated by referring to said delay time required to operate said generic-circuit when predetermined input information is inputted to said generic-circuit.

11. A method of logic calculation according to claim 7, wherein said library possessing graph data of standard delay times is generated by the steps of:

executing simulation for acquiring graph data consisting of a plurality of points with respect to plural types of logic cells having different structures of inner circuits by changing delay times after a signal is inputted until the signal is outputted, to determine load capacity and/or transient time of the inputted signal;

processing said acquired graph data for each logic cell into data having an origin at a common value; and extracting approximate data as general-use graph data by comparing said processed plurality of graph data.

12. A logic calculator comprising:

a library possessing graph data in the form of a plurality of relational graphs of standard delay times having an origin in common with respect to each of a plurality logic cells;

a selector for acquiring graph data of a logic cell which is an object of calculation from said library;

a memory for setting an inherent condition of said logic cell which is an object of calculation; and an arithmetic and logical unit for calculating the delay time of said logic cell which is an object of calculation by adding said set inherent condition to said acquired graph data.

13. A method of storing graph data, obtained from a plurality of different types of logic cells into a cell library, the method comprising the steps of:

executing circuit simulations for the plural types of logic cells, wherein each of the plural types corresponds to a plurality of inner circuits having corresponding different structures, by varying an input-output slew rate and a passive element value of each logic cell to acquire graph data in the form of a plurality of relational graphs for each logic cell;

processing said acquired graph data for each logic cell into characteristic data having an origin at a common value;

finding differences between said common value and the graph data values at a point in which said passive element value is 0;

comparing the characteristic data for each logic cell to find general-use characteristic data having a similar characteristic for use as general-use graph data; and storing said general-use characteristic data into the cell library along with names of said plurality of logic cells and said differences.

* * * * *